United States Patent

Berry, Jr. et al.

[11] Patent Number: 5,847,574
[45] Date of Patent: Dec. 8, 1998

[54] METHOD AND APPARATUS FOR TESTING ENCAPSULATED CIRCUITS

[75] Inventors: John C. Berry, Jr., Dove Canyon; Larry L. Fogg, Los Angeles, both of Calif.

[73] Assignee: McDonnell Douglas Corporation, Hazelwood, Mo.

[21] Appl. No.: 778,385

[22] Filed: Dec. 31, 1996

[51] Int. Cl.⁶ .................................................. G01R 31/26
[52] U.S. Cl. ...................................... 324/765; 324/158.1
[58] Field of Search ................................... 324/760, 765, 324/158.1; 73/40.7

[56] References Cited

U.S. PATENT DOCUMENTS

| | | | |
|---|---|---|---|
| 3,664,786 | 5/1972 | Devine | 425/99 |
| 3,675,468 | 7/1972 | Caccamesi et al. | 73/40.7 |
| 3,738,158 | 6/1973 | Farell et al. | 73/40.7 |
| 4,427,496 | 1/1984 | Katz | 205/791 |
| 4,681,718 | 7/1987 | Oldham | 264/102 |
| 5,076,906 | 12/1991 | DerMarderosian, Jr. | 205/791 |
| 5,137,663 | 8/1992 | Conaway | 264/36.15 |
| 5,357,673 | 10/1994 | Polak et al. | 29/840 |
| 5,369,983 | 12/1994 | Grenfell | 73/40.7 |
| 5,419,864 | 5/1995 | Sheer et al. | 264/254 |
| 5,703,482 | 12/1997 | Cripe et al. | 324/158.1 |

Primary Examiner—Josie Ballato
Assistant Examiner—Russell M. Kobert
Attorney, Agent, or Firm—Brooks & Kushman P.C.

[57] ABSTRACT

A method and apparatus for evaluating the suitability of an encapsulated electrical circuit for use in a particular service environment provides for immersing the encapsulated circuit in a slightly conductive evaluating fluid whose chemical composition approximates the environment into which the circuit will be placed in service. The thus-immersed circuit is then subjected to a reduced-pressure testing environment to draw air and other retained gases out of internal voids within the encapsulated circuit. The pressure of the testing environment is slowly increased to cause the encapsulated circuit to ingest a quantity of the evaluating fluid. An input signal is then applied to the circuit and the circuit's response to the input signal is monitored over a predetermined time period.

19 Claims, 2 Drawing Sheets

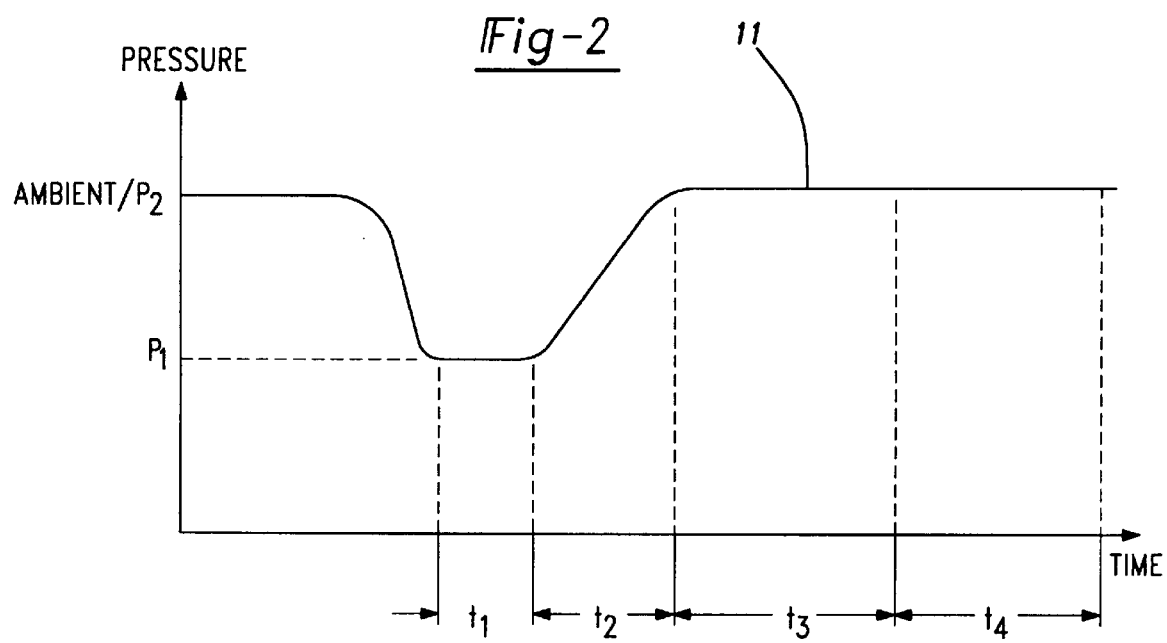
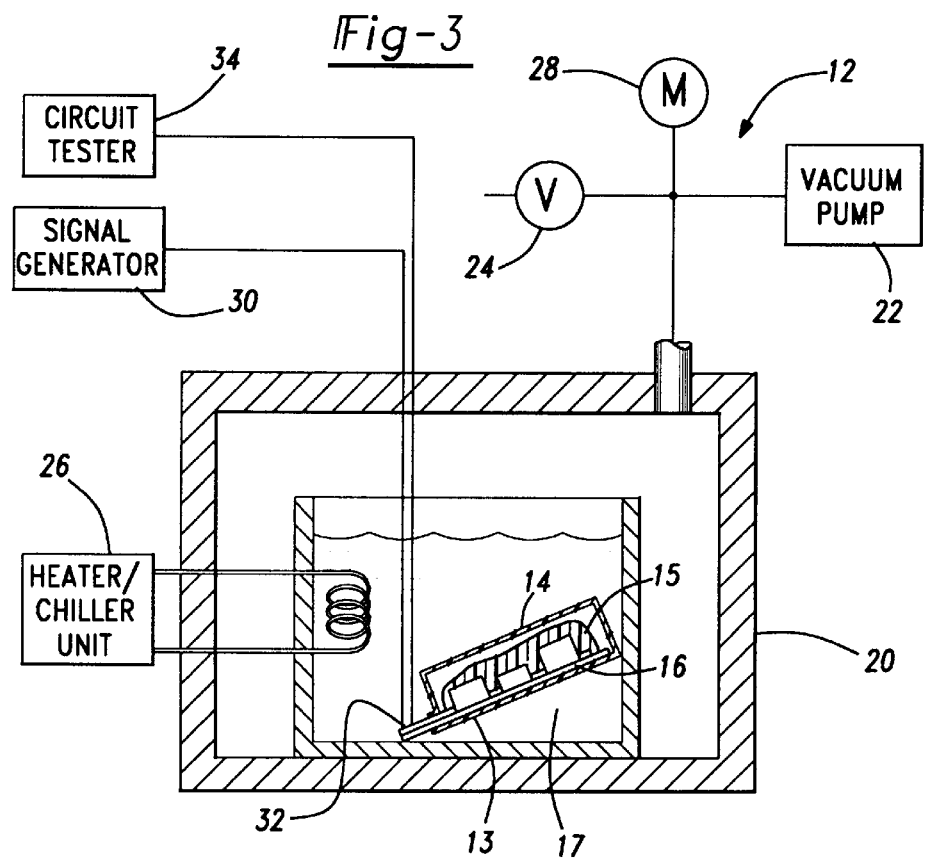

METHOD AND APPARATUS FOR TESTING ENCAPSULATED CIRCUITS

TECHNICAL FIELD

The present invention relates generally to methods and apparatus for the destructive testing of encapsulated electrical and electronic circuits and, more particularly, methods and apparatus for evaluating the long-term suitability of such encapsulated circuits for use in service environments likely to experience pressure cycling.

BACKGROUND ART

The prior art has long recognized the deleterious effects which a service environment may have on electrical and electronic components and their associated circuitry. For example, where the service environment includes chemicals likely to cause the deterioration of component performance over time—or perhaps likely even to precipitate a premature failure of the component—the prior art teaches encapsulation of such circuitry within a material which is itself relatively less susceptible to chemical attack.

Under a first prior art approach, the circuit is encapsulated by applying an encapsulating material directly onto the circuit. Specifically, the encapsulating material often comprises an applied polymeric resin or thermoset elastomer formed by mixing together two or more liquid constituents, applying the resulting mixture to the circuit, and allowing the mixture to cure. Unfortunately, the applied encapsulating material often contains minute air bubbles or "voids" generated during the mixing of its liquid constituents, and may further contain additional gaps or voids situated between the applied encapsulating material and the circuit itself as a result of improper or incomplete application of the encapsulating material to the circuit.

Under a second prior art approach, the encapsulating material forms an encapsulating housing or "external packaging" in which the circuit is otherwise secured to isolate the circuit from direct contact with the service environment. Unfortunately, as with encapsulating materials that are applied directly to the circuit, such external packaging similarly defines internal voids within which air or other gases may become entrapped upon assembly of the package about the circuit.

In the event that a circuit encapsulated using either the first approach or the second approach, or both, is subjected to pressure cycling in its service environment, for example, where the service environment includes exposing the circuit to pressures lower than the pressure at which the encapsulating material was cured, the resulting pressure differential will tend to pull air (or any other embedded gas) out of the various voids formed within the encapsulated circuit. Thereafter, upon relative repressurization of the service environment, the encapsulating circuit will tend to draw in or "ingest" certain constituents of the service environment, thereby presenting a potential latent failure mode for the circuit over time which cannot otherwise be detected using known standards.

Thus, for example, where an encapsulated circuit is deployed within the pressurized cabin of an aircraft and, hence, subjected to a moisture-laden service environment having a pressure which regularly varies approximately from ambient sea level pressure in a standard atmosphere to a pressure equivalent of perhaps 8,000 feet (2.4 km) of altitude in a standard atmosphere, such moisture may be ingested into the encapsulated circuit. Still further, to the extent that the service environment includes contaminants or impurities soluble in such moisture, these contaminants or impurities may likewise tend to be drawn with the moisture into the encapsulated circuit, often resulting in the chemical deterioration of the encapsulating material itself. The long-term effects of such ingested moisture, contaminants and impurities may contribute to the premature failure of encapsulated ballast circuits used for aircraft cabin interior lighting, notwithstanding the fact that the ballast circuits had passed all known industry tests.

Similar ingestion-induced failures may be expected of encapsulated circuits deployed in other service environments featuring pressure cycling in the presence of such chemicals. By way of example only, susceptible circuits may be found in other modes of transportation, such as automobiles, trucks, trains, submarines and even high-rise elevators, all of which can experience pressure cycling during their normal operation.

DISCLOSURE OF INVENTION

It is an object of the invention to provide a method and apparatus for evaluating the long-term suitability of an encapsulated circuit for use in a pressure-cycled service environment.

It is also an object of the invention to provide a low-cost method and apparatus for evaluating the susceptibility of an encapsulated circuit to premature failure due to the ingestion of moisture or other contaminants into the circuit's encapsulating material.

Under the invention, an encapsulated electrical circuit is evaluated for use in a variable-pressure service environment by immersing the circuit in an evaluating fluid. The evaluating fluid preferably has a chemical composition which approximates the service environment in which the circuit will be used. Thus, in a disclosed exemplary method for evaluating an encapsulated ballast circuit for an aircraft's cabin lighting which will be exposed to a moisture-laden service environment, the evaluating fluid is preferably an aqueous solution which includes a chemical salt, an acid or a base to render the solution at least slightly electrically conductive.

The thus-immersed encapsulated circuit is subjected to a plurality of evaluating pressures, whereby air trapped within the circuit is replaced by a quantity of ingested evaluating fluid. For example, in the disclosed exemplary method, an aircraft ballast circuit, which itself includes both an encapsulating package and encapsulating material applied directly to the circuit, is subjected to a first evaluating pressure which preferably approximates the pressure equivalent to 8,000 feet (2.4 km) of altitude, that is, the minimum repetitive service pressure to which the circuit will be exposed during its normal service life aboard the aircraft. The immersed circuit is preferably subjected to the first evaluating pressure for a first predetermined time, whereby a substantial portion of the air trapped within the encapsulated circuit is drawn from the encapsulated circuit. The immersed circuit is then subjected to a second evaluating pressure which is preferably greater than or equal to ambient sea level pressure in a standard atmosphere, that is, the maximum service pressure to which it will be exposed on the aircraft. In the disclosed exemplary method, in order to enhance ingestion of the evaluating fluid into the circuit's encapsulating material, the pressure is preferably increased from the first evaluating pressure to the second evaluating pressure over a second predetermined time period, with the immersed circuit preferably further being subjected to the second evaluating pressure for a third predetermined time period.

With the circuit thus having been subjected to pressure cycling while immersed in the evaluating fluid, an input signal, which may include power, is then applied to the circuit, and the circuit's response to the input signal is monitored to detect any abnormality. In an exemplary method, the input signal is applied and the circuit is monitored over a fourth predetermined time period. If an abnormality in circuit response is detected or observed, the circuit will be deemed to be unsuitable for use in the service environment for which it was evaluated. If no abnormality in circuit response is detected or observed during the fourth time period, the circuit may preferably be subjected to further pressure cycling while immersed in the evaluating fluid in order to ensure that the circuit is not susceptible to latent failures due to deleterious ingestion of the service environment.

A desirable method for evaluating an encapsulated circuit may further include heating the circuit to a first temperature no greater than its maximum operating temperature while the circuit is immersed and pressure-cycled in the evaluating fluid. The heating step facilitates the escape of trapped air from within the encapsulating material as the circuit is otherwise exposed to the evaluating pressures. A desirable method for evaluating an encapsulated circuit may also include removing the circuit from the evaluating fluid to facilitate application of the input signal and the monitoring of the circuit's response to the input signal.

An apparatus in accordance with the invention for evaluating an encapsulated electrical circuit for use in a variable-pressure service environment includes a pressure-tight chamber containing a quantity of a fluid sufficient to fully immerse the circuit in the fluid. As noted above, the fluid preferably approximates the chemical composition of the service environment in which the circuit will be used, and may be an aqueous solution which includes a chemical salt, an acid or a base.

The apparatus also includes a pump and a pressure control valve in fluid communication with the chamber, such that the pump and the valve may be selectively operated to bring the pressure within the chamber to a first evaluating pressure and a second evaluating pressure. The first evaluating pressure is preferably less than or equal to the minimum service pressure to which the circuit will likely be exposed, while the second evaluating pressure is preferably greater than or equal to the maximum service pressure to which the circuit will likely be exposed. Most preferably, the pressure control valve operates to slowly repressurize the chamber from the first pressure to the second pressure over a predetermined time period.

The apparatus further includes a signal generator for applying an input signal to the circuit; and tester for monitoring circuit response to the input signal. The apparatus may further include a heater for heating the evaluating fluid to a temperature no greater than the maximum service temperature of the circuit, thereby further facilitating the escape of trapped air from within the circuit's encapsulating material.

While an exemplary method and apparatus for practicing the invention are illustrated and disclosed, these embodiments should not be construed to limit the claims. It is anticipated that various modifications and alternative designs may be made without departing from the scope of the invention.

BRIEF DESCRIPTION OF DRAWINGS

FIG. 2 is a plot of vacuum chamber pressure versus time in accordance with the exemplary method illustrated in FIG. 1; and FIG. 3 is a diagrammatic schematic, partially in cross-section, of an apparatus used in practicing the exemplary method illustrated in FIG. 1.

BEST MODE(S) FOR CARRYING OUT INVENTION

Figure 1:
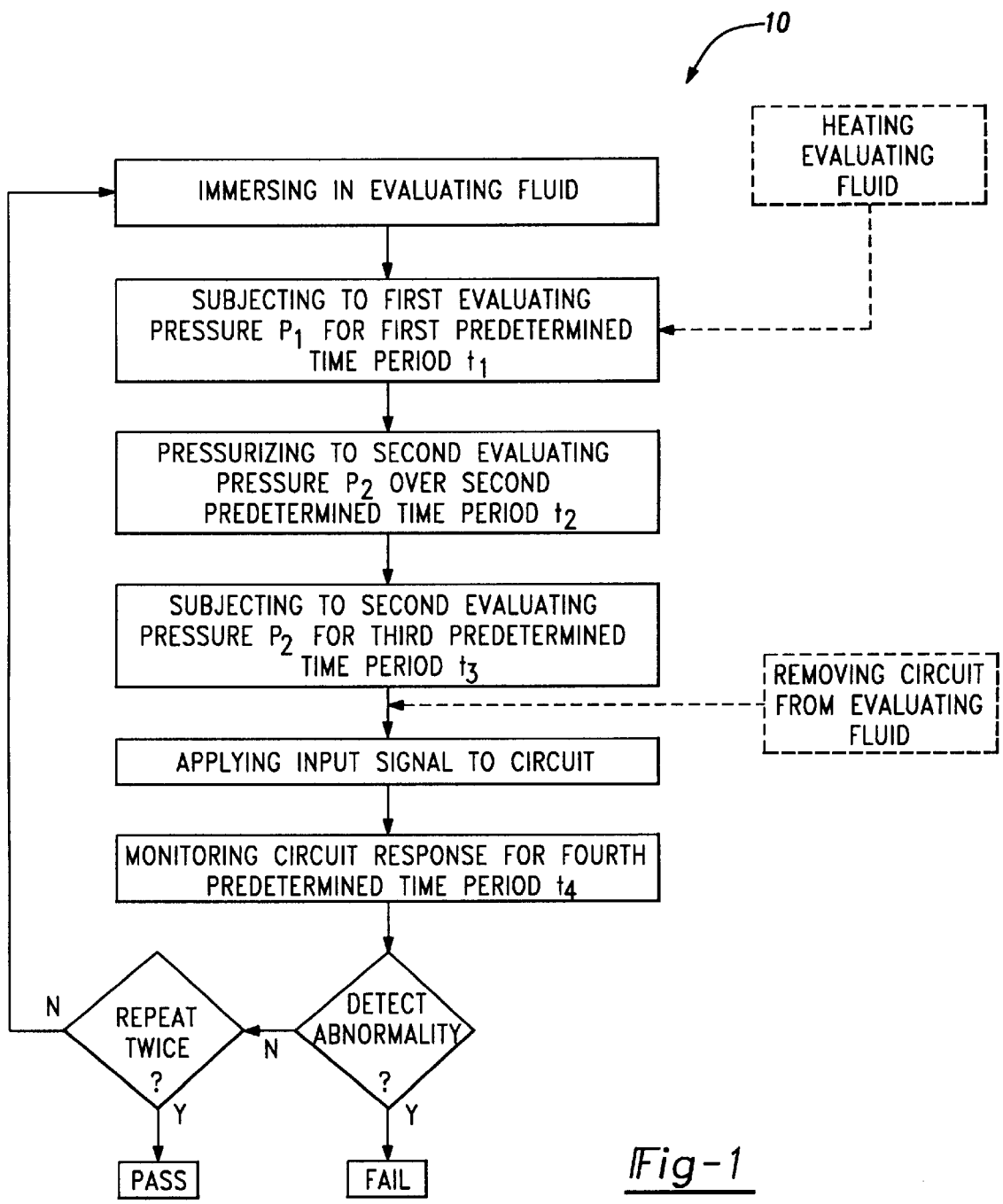
FIG. 1 is a flow diagram illustrating an exemplary method for evaluating encapsulated aircraft-cabin-lighting ballast circuits in accordance with the invention.

Referring to the Drawings, FIG. 1 is a flow diagram of an exemplary method 10 for evaluating an encapsulated ballast circuit for use in controlling fluorescent lighting disposed within the passenger cabin an aircraft, while FIG. 2 is a plot 11 of evaluating pressure versus time for the exemplary method 10, and FIG. 3 is an apparatus 12 for practicing the exemplary method 10. As seen in the Drawings, the exemplary method 10 begins by immersing the encapsulated circuit 13, which itself includes both encapsulating packaging 14 and a quantity of encapsulating material 15 applied directly onto its electronic circuitry 16, in a quantity of an evaluating fluid 17. It is to be understood, however, that the method of the present invention may also be practiced in connection with an encapsulated circuit 13 which has only encapsulating packaging 14 or applied encapsulating material 15. It will be further understood that, while the invention contemplates partial immersion of the encapsulated circuit 13 in the evaluating fluid 17, the circuit 13 is preferably fully immersed in the fluid 17. The fluid 17 is initially maintained at ambient sea level pressure, which is the nominal maximum pressure at which the ballast circuit 13 will likely operate during the course of its normal service life.

In accordance with the invention, a fluid 17 suitable for evaluating the encapsulated circuit 13 preferably approximates the chemical composition of the service environment in which the circuit 13 will be used, including such impurities and contaminants as may be expected to appear in the service environment during the circuit's normal service life. Since ambient aircraft cabin moisture often condenses on aircraft cabin fixtures at altitude, by way of example only, a suitable fluid 17 for evaluating such ballast circuits 13 may be ordinary tap water. More preferably, for evaluating such ballast circuits 13, a suitable fluid 17 is an aqueous solution containing a small quantity of a chemical salt, such as NaCl in a concentration of perhaps about 0.7% by weight, or, alternatively, a small quantity of either an acid or a base, or both. The small quantity of the chemical salt, acid or base is intended to render the fluid 17 slightly electrically conductive and, hence, approximate various contaminants and impurities which are likely to be found in the cabin moisture condensing upon the ballast circuit's external packaging 14. In this way, the chemical salt, acid and/or base similarly promote the presence of ions in the fluid 17 which is ingested into the circuit 13 when practicing the invention.

The encapsulated circuit 13, whose external packaging 14 is now immersed in the evaluating fluid 17, is subjected to a first evaluating pressure $P_1$, within a vacuum chamber 20 through operation of a vacuum pump 22, as illustrated in FIG. 2. Specifically, in the case of an aircraft cabin ballast circuit 13, the first evaluating pressure $P_1$ is preferably no greater than the pressure equivalent to 8,000 feet (2.4 km) of altitude in a standard atmosphere, that is, the minimum cabin pressure for an average passenger aircraft and, hence, the likely minimum service pressure to which the circuit 13 will be repeatedly exposed over its normal service life. Thus, in the exemplary method 10, the chamber 20 is evacuated by the vacuum pump 22 from ambient pressure to the first evaluating pressure $P_1$.

In accordance with the invention, upon evacuation of the chamber 20 to the first evaluating pressure $P_1$, air trapped within the circuit's external packaging 14 and the applied encapsulating material 15 is pulled from within the circuit 13 by the resulting vacuum.

In the exemplary method 10, once the first evaluating pressure $P_1$ has been achieved and has otherwise stabilized within the chamber 20, as indicated on a pressure gauge 24 in fluid communication with the chamber 20, the first evaluating pressure $P_1$, is preferably maintained for a first predetermined time period $t_1$ so as to draw additional air from within the circuit's external packaging 14 and the applied encapsulating material 15. While a suitable length for the first time period $t_1$, has been determined to be perhaps about 20 to 30 minutes, it will be appreciated that the invention contemplates time periods $t_1$, of various lengths within which to expose the encapsulated circuit 13 to the first evaluating pressure $P_1$ to ensure that a substantial portion of the air trapped within the circuit 13 has been drawn out of the circuit 13 by the vacuum.

In accordance with another feature of the invention, the exemplary method 10 may include heating the evaluating fluid 17 and, hence, the encapsulated circuit 13 as through use of a heater/chiller unit 26 so as to raise the temperature of the circuit 13 to a temperature not to exceed the circuit's maximum operating temperature. The heat will further facilitate the escape of trapped air from within the encapsulated circuit 13, for example, as the circuit 13 is subjected to the first evaluating pressure $P_1$ within the chamber 20.

With a substantial portion of the trapped air now drawn from within the encapsulated circuit 13, the pressure within the chamber 20 is raised from the first evaluating pressure $P_1$, to a second evaluating pressure $P_2$. In the case of the ballast circuit 13, the second evaluating pressure $P_2$ is preferably no less than the pressure equivalent to ambient sea level pressure in a standard atmosphere, that is, the maximum cabin pressure likely to be encountered by the circuit 13 during its normal service life aboard an aircraft. Thus, where the exemplary method 10 is practiced at a location where the ambient pressure approximates ambient sea level pressure in a standard atmosphere, the pressure within the chamber 20 may conveniently be raised from the first evaluating pressure $P_1$ to the second evaluating pressure $P_2$ by operating a pressure control valve 28 connected to the chamber 20 while observing the repressurization rate on a pressure gauge 28.

In the exemplary method 10 of practicing the invention, the vacuum chamber 20 is preferably slowly pressurized to the second evaluating pressure $P_2$ over a second predetermined period $t_2$ of time, as by periodically operating the pressure control valve 24 while monitoring chamber pressure on a pressure gauge 28. The slow relative pressurization of the immersed circuit 13 within the chamber 20 is believed to enhance the ingestion of evaluating fluid 17 into both the circuit's external packaging 14 and its applied encapsulating material 15. While a suitable length for the second time period $t_2$ has been determined to be perhaps about 30 minutes, it will be appreciated that the invention contemplates time periods $t_2$ of various lengths over which to slowly pressurize the circuit 13 and, thus, enhance fluid ingestion into the circuit 13.

In accordance with another feature of the invention, in the exemplary method 10 illustrated in FIG. 1, the encapsulated circuit 13 is permitted to remain immersed in the evaluating fluid 17 at the second evaluating pressure $P_2$ for a third predetermined time period $t_3$, whereupon the external packaging 14 and the applied encapsulating material 15 are permitted to ingest an additional amount of the evaluating fluid 17. While the invention contemplates time periods $t_3$ of various lengths over which to maintain the immersed circuit 13 at the second evaluating pressure $P_2$ to enhance fluid ingestion, suitable lengths for the third time period $t_3$ appear to range from perhaps about one hour to perhaps about 24 hours.

With the chamber pressure preferably still at the second evaluating pressure $P_2$ (to thereby maintain the thus-ingested fluid 17 within the encapsulated circuit 13) or, less preferably, at a pressure intermediate the first evaluating pressure $P_1$ and the second evaluating pressure $P_2$ (as achieved through selective operation of the vacuum pump 22 and the pressure control valve 24), an input signal, which may include power, generated by a signal generator 30 or other appropriate power source is applied to the circuit 13 via appropriate leads 32. The circuit's response to the input signal is thereafter monitored on a circuit tester 34 in order detect any abnormality in the circuit's response. Upon detecting or observing an abnormality in the circuit's response, the circuit 13 will be deemed to have "failed" the evaluation, thereby raising an issue as to the circuit's suitability for its intended service environment.

Since the second evaluating pressure $P_2$ for the ballast circuit 13 may conveniently be the ambient pressure where the exemplary method 10 is being practiced and, further, to the extent that application of the input signal to the circuit 13 and the monitoring of the circuit's response to the input signal may be facilitated by the removal of the circuit 13 from the evaluating fluid 17, the invention further contemplates such removal of the circuit 13 from the fluid 17. In this regard, it is noted that the removal of the circuit 13 from the evaluating fluid may advantageously permit the monitoring of additional circuit operating parameters, such as the external circuit package temperature, to further facilitate identification of any abnormal circuit response to the input signal. In this regard, it is noted that the invention contemplates the weighing of the encapsulated circuit 13 both before and after being immersion and pressure-cycled, with the difference in weights providing an additional measure as to the quality of the circuit's encapsulation.

Under the invention, the input signal is preferably applied, and the circuit's response is preferably monitored, for a fourth predetermined time period $t_4$—even if that time period $t_4$ extends beyond the point at which one or more of the circuit's internal mechanisms (e.g., fuses) operate to inhibit circuit functionality—since it is believed that the latent failure mode giving rise to the invention remains viable notwithstanding nominal inoperability of the circuit. To the extent that no abnormality in circuit response is detected or observed during the fourth time period $t_4$, the exemplary method 10 repeats the immersion/pressure-cycling steps so as to induce ingestion of additional evaluating fluid 17 into the encapsulating material 18, whereupon the input signal is reapplied and the circuit's response is once again monitored for abnormalities.

In the exemplary method, if no abnormality is detected or observed through three iterative immersion-pressure cycles, the subject circuit 13 is deemed to have "passed" the evaluation and may be considered to be a component not likely to fail in its intended service environment due to moisture ingestion. It will be appreciated, however, that, in accordance with the invention, the number of immersion-pressure cycles to which any given circuit will be subjected will depend upon many factors, including the criticality of the circuit, the likely length of service, and cost.

The above method is amenable to, and the invention contemplates, automation of the various method steps. For example, the apparatus may include a control unit which is responsive to a sensor (neither shown) with which to detect and control the rate of change of pressure within the vacuum chamber 20 over time.

While an embodiment of the invention has been illustrated and described, it is not intended that such disclosure illustrate and describe all possible forms of the invention. It is intended that the following claims cover all modifications and alternative designs, and all equivalents, that fall within the spirit and scope of the invention. For example, the invention has been described in connection with the evaluation of encapsulated ballast circuits 13 for use in an aircraft cabin service environment, wherein the service pressure varies from about ambient sea level pressure to the pressure equivalent of perhaps about 8,000 feet (2.4 km) of altitude above sea level. However, the invention contemplates evaluating the suitability of encapsulated circuits for service environments in which the circuit is subjected to pressures higher than either ambient sea level pressure or the pressure at which its applied encapsulating material was cured, and wherein the resulting service pressure differential may likewise tend to cause "ingestion" of certain service environment constituents into the circuit. In such cases, it will be understood that the invention contemplates subjecting the immersed encapsulated circuit 13 to the higher evaluating pressure (the "second pressure $P_2$" in the disclosed exemplary method 10) either before or after subjecting the circuit 13 to the lower evaluating pressure (the "first pressure $P_1$" in the disclosed exemplary method 10).

Similarly, while the exemplary method 10 illustrated in FIG. 1 includes the optional step of removing the encapsulated circuit 13 from the evaluating fluid 17 in order to facilitate application of the input signal and the monitoring of the circuit's response, it will be appreciated that the invention contemplates application of the input signal and the monitoring of the circuit's response while the circuit 13 itself remains immersed in the evaluating fluid 17. And, while the exemplary method 10 illustrated in FIG. 1 discloses the application of the input signal and the monitoring of the circuit response after only one immersion-pressure cycle, the invention contemplates subjecting the encapsulated circuit 13 to multiple pressure cycles while immersed in the evaluating fluid 17 prior to application of the input signal.

What is claimed is:

1. A method for evaluating an encapsulated electrical circuit for use in a service environment, wherein the service environment is characterized by pressure cycling between a minimum service pressure and a maximum service pressure, the method comprising:

immersing the circuit in an electrically-conductive evaluating fluid;

subjecting the immersed circuit to a first evaluating pressure;

subjecting the immersed circuit to a second evaluating pressure, wherein the second pressure is greater than the first pressure;

removing the circuit from the fluid;

applying an input signal to the circuit after the circuit is removed from the fluid; and monitoring the response of the circuit to the input signal.

2. The method of claim 1, wherein the fluid has a chemical composition approximating the composition of the service environment.

3. The method of claim 1, wherein the fluid is an aqueous solution.

4. The method of claim 1, wherein the first evaluating pressure is less than or equal to the minimum service pressure.

5. The method of claim 1, wherein the second evaluating pressure is greater than or equal to the maximum service pressure.

6. The method of claim 1, wherein the second evaluating pressure is ambient pressure.

7. The method of claim 1, wherein the immersed circuit is pressurized from the first evaluating pressure to the second evaluating pressure.

8. The method of claim 1, further including heating the immersed circuit to a first temperature no greater than a maximum operating temperature for the circuit.

9. The method of claim 1, further including monitoring the response of the circuit to the input signal for a first predetermined time period.

10. The method of claim 9, wherein the immersed circuit is repeatedly subjected to the first evaluating pressure and the second evaluating pressure if no abnormality in circuit response is detected during the first time period.

11. A method for evaluating an encapsulated electrical circuit for use in a service environment, the service environment being characterized by pressure cycling between a minimum service pressure and a maximum service pressure, the method comprising:

immersing the circuit in an electrically-conductive evaluating fluid;

subjecting the immersed circuit to a first evaluating pressure for a first predetermined time period;

increasing the immersed circuit to a second evaluating pressure over a second predetermined time period;

subjecting the immersed circuit to a second evaluating pressure for a third predetermined time period;

removing the circuit from the fluid;

applying an input signal to the circuit after the circuit is removed from the fluid; and monitoring the response of the circuit to the input signal for a fourth predetermined time period.

12. An apparatus for evaluating an encapsulated electrical circuit for use in a service environment, the service environment being characterized by pressure cycling between a minimum service pressure and a maximum service pressure, the apparatus comprising:

a pressure-tight chamber containing a quantity of an electrically-conductive evaluating fluid sufficient to immerse the circuit in the fluid;

a pump and a pressure control valve in fluid communication with the chamber, wherein the pump and the valve selectively operate to bring the pressure within the chamber to a first evaluating pressure and a second evaluating pressure;

a signal generator for applying an input signal to the circuit when the circuit is removed from the fluid; and a tester for monitoring circuit response to the input signal.

13. The apparatus of claim 12, wherein the fluid approximates the chemical composition of the service environment.

14. The apparatus of claim 12, wherein the fluid is an aqueous solution.

15. The apparatus of claim 12, wherein the first evaluating pressure is less than or equal to the minimum service pressure.

16. The apparatus of claim 15, wherein the pump operates to evacuate the chamber to the first evaluating pressure.

17. The apparatus of claim 12, wherein the second pressure is greater than or equal to the maximum service pressure.

18. The apparatus of claim 12, wherein the valve operates to slowly pressurize the chamber from the first evaluating pressure to the second evaluating pressure over a predetermined time period.

19. The apparatus of claim 12, further including a heater for heating the immersed circuit to a first temperature no greater than a maximum operating temperature for the circuit.

* * * * *